United States Patent [19]

McNeilly

[11] Patent Number: 4,778,559
[45] Date of Patent: Oct. 18, 1988

[54] SEMICONDUCTOR SUBSTRATE HEATER AND REACTOR PROCESS AND APPARATUS

[75] Inventor: Michael A. McNeilly, Palo Alto, Calif.

[73] Assignee: Advantage Production Technology, Albuquerque, N. Mex.

[21] Appl. No.: 919,313

[22] Filed: Oct. 15, 1986

[51] Int. Cl.⁴ .............. C30B 23/02; C30B 25/10; F24H 1/00; H05B 3/60

[52] U.S. Cl. .................. 156/612; 156/613; 118/725; 118/728; 118/500; 219/385; 219/399; 219/430; 219/439; 219/462; 219/521; 219/530; 219/540

[58] Field of Search ............. 156/612, 613; 118/725, 118/728, 500, 503; 427/86, 255, 248.1; 219/385, 399, 430, 439, 462, 521, 530, 540, 316, 319, 523

[56] References Cited

U.S. PATENT DOCUMENTS

| | | | |
|---|---|---|---|
| 2,897,331 | 7/1959 | McFarlane et al. | 219/504 |
| 3,083,286 | 3/1963 | Swetlitz | 219/464 |
| 3,391,270 | 7/1968 | Harris et al. | 118/725 |
| 3,505,499 | 4/1970 | Walter | 219/439 |
| 3,536,893 | 10/1970 | Cranley | 219/319 |
| 3,623,712 | 11/1971 | McNeilly | 263/42 |
| 3,673,785 | 6/1972 | Drugmand et al. | 219/316 |
| 3,815,575 | 6/1974 | Davis | 219/439 |
| 3,983,359 | 9/1976 | Walker et al. | 219/319 |
| 4,047,496 | 9/1977 | McNeilly et al. | 118/49.1 |
| 4,081,313 | 3/1978 | McNeilly et al. | 156/610 |
| 4,456,186 | 6/1984 | Ando | 219/316 |
| 4,496,609 | 1/1985 | McNeilly et al. | 427/55 |
| 4,579,609 | 4/1986 | Reif et al. | 156/612 |

FOREIGN PATENT DOCUMENTS 0082092 6/1983 European Pat. Off. ............ 219/319

*Primary Examiner*—Asok Pal
*Attorney, Agent, or Firm*—Limbach, Limbach & Sutton

[57] ABSTRACT

A reaction system and process for uniformly heating semiconductor substrates and a device for supporting the same and direct conductive heating of IC wafers within a reactor are described. The substrate is held in direct contact with the heating source positioned within the reactor. The heat source is a thermal delivery module made of material such as solid silicon carbide, or high temperature material containing resistive heating elements. The heat is uniformly transferred to the walls of the module by a molten metal having a low melting point and high boiling point such as essentially indium or bismuth or a eutectic of indium and bismuth.

27 Claims, 4 Drawing Sheets

SEMICONDUCTOR SUBSTRATE HEATER AND REACTOR PROCESS AND APPARATUS

BACKGROUND OF THE INVENTION

1. Field of Invention

This invention relates to an improved heat source and method, including a thermal delivery module for uniformly heating semiconductor substrates and to a semiconductor thin film processing treatment system and process incorporating the thermal delivery module. More specifically, the field of the invention in one particular application involves the vapor deposition of epitaxial silicon films, utilizing a thermal delivery module with a very low thermal gradient across the entire area of the module surface used for conduction heating of semiconductor substrates such as silicon wafers used in integrated circuit (IC) manufacture.

2. Background Art

In various semiconductor fabricating processes the semiconductor substrate or wafer is heated. Usually it is important to heat the wafer uniformly across the entire mass and surface of the wafer. In certain processes, such as the chemical vapor deposition of epitaxial silicon films, nonuniform heating can result in nonuniform deposition.

In chemical vapor deposition systems, it has been highly desirable to carry out the deposition reaction in a cold-wall type reaction chamber to permit transmission of radiant heating energy through the reaction chamber walls and also to avoid film deposition on the chamber walls. Cold-wall systems were additionally desirable because they permitted the deposition of high purity films, such as epitaxial silicon and silicon dioxide films. In hot wall systems, impurities could be evolved from, or permeate through the heated reaction chamber walls. Because such impurities would interfere with and adversely affect the purity of the coating, and cause particulate contamination, cold-wall reaction chambers were employed to preclude such impurity diffusion or permeation and particulate precipitation.

Chemical deposition processes have been developed formerly which permit heating of a substrate positioned within a reaction chamber without simultaneously heating the reaction chamber walls. Initially, processes such as epitaxial silicon employed the use of radio frequency (RF) induction heating of a conducting susceptor positioned within the reaction chamber, the walls of which were formed of nonconducting or insulating material, such as quartz.

However, such RF heating techniques, while generally producing the stated objective in a cold-wall reaction chamber, had several inherent and important disadvantages which make RF heating undesirable under many circumstances. For example, RF generators are very expensive to manufacture and to maintain, as well as being very large in size thereby consuming large areas of expensive floor space and must be located close to the epitaxial reactor. Moreover, the high voltages required for the RF coils produced substantial personnel hazards, was energy inefficient and frequently interfered with adjacent electronic equipment.

Subsequently, infrared (IR) radiant energy of shortwave length was developed to overcome the inherent disadvantages of RF heating. IR heating utilized high intensity, high temperature lamps generating IR of approximately one micron which could pass through quartz with minimal absorbance of heat and thus maintain the cold wall criteria of a chemical vapor deposition (CVD) reactor. The lamps were powered through solid state power supplies and controllers thereby eliminating the use of RF. Like RF heating, a susceptor was required inside the reaction chamber to support the substrates to be coated and to absorb the transmitted IR energy similar to the indirect RF coupling with the susceptor. However, experience has demonstrated that the IR heating method, though supplanting the RF method, had a number of its own inherent disadvantages. Those disadvantages found in common with the RF method included expensive manufacture and maintenance, energy inefficiency and requiring a susceptor for substrate support and energy absorption. Additional disadvantages unique to the IR method include temperature nonuniformity, the necessity in rotating the susceptor and substrates, streaking of substrate surfaces, high lamp failure rate, low system reliability and the inability to automate the process step. The process automation nonuniform heating of larger substrates utilizing IR energy presents a greater problem in newer wafer fabrication processes utilizing large wafers such as 6 and 8 inches in diameter as contrasted with the older conventional 3, 4 and 5 inch diameter wafers.

SUMMARY OF THE INVENTION

The instant invention relates to an improved heating apparatus and process having a very low thermal gradient across the entire area of the apparatus surface used for heating. The temperature uniformity characteristics of the invention makes it especially well suited for use in a reactor for thin film chemical vapor deposition of substrates, such as IC wafers, with various thin films, i.e., epitaxial silicon, silicon dioxides, etc., to form the fundamental electronic structures of the IC. For these IC applications, it is of utmost importance that the apparatus providing the heat be very uniform in temperature over its entire surface used for heating, such that the substrate in direct contact with the apparatus surface will be conductively and radiantly uniformly heated and thereby result in uniform thin film depositions on the surface of the substrate containing the ICs.

In contrast to the former methods, the heat source of the instant invention, which has a substrate support device connected to its external walls, is positioned inside the reaction chamber thereby eliminating the use of a susceptor while maintaining the cold wall criteria. With the present invention the chamber wall need not be transparent to IR or non-absorbing of heat nor, nonconductive; in fact, in the preferred embodiment, both the chamber walls and the container of the heating apparatus can be of solid silicon carbide, a metal such as steel or titanium for a ceramic as well as quartz which is inert or can be cleaned of any undesirable deposition with any commonly available etchings.

The advantages of the instant invention over the former are significant. In addition to the advantages mentioned previously, the expense of manufacture and general maintenance of the system are minimal compared to RF and IR. Moreover, the apparatus and method of the present invention are highly energy efficient and significantly more reliable with less systematic breakdowns. Also, this invention produces maximum uniformity of deposition on the substrate surface thereby eliminating substantial IC yield loss. Additionally, the process and apparatus of this invention permits automation of the substrate processing operation.

While the instant invention is disclosed in conjunction with a CVD reactor, it is to be understood that the invention is applicable in any semiconductor processing method or apparatus required to be heated. That is, while this invention has particular utility in conjunction with a CVD system for thin film deposition on substrates with various types of known films, its utility is not so limited. Similarly, while this invention is disclosed herein in conjunction with a particular type of CVD reactor, it should be understood that utility of this invention in conjunction with other types and constructions of reactors is also contemplated.

DESCRIPTION OF THE PREFERRED EMBODIMENT

Figure 1:
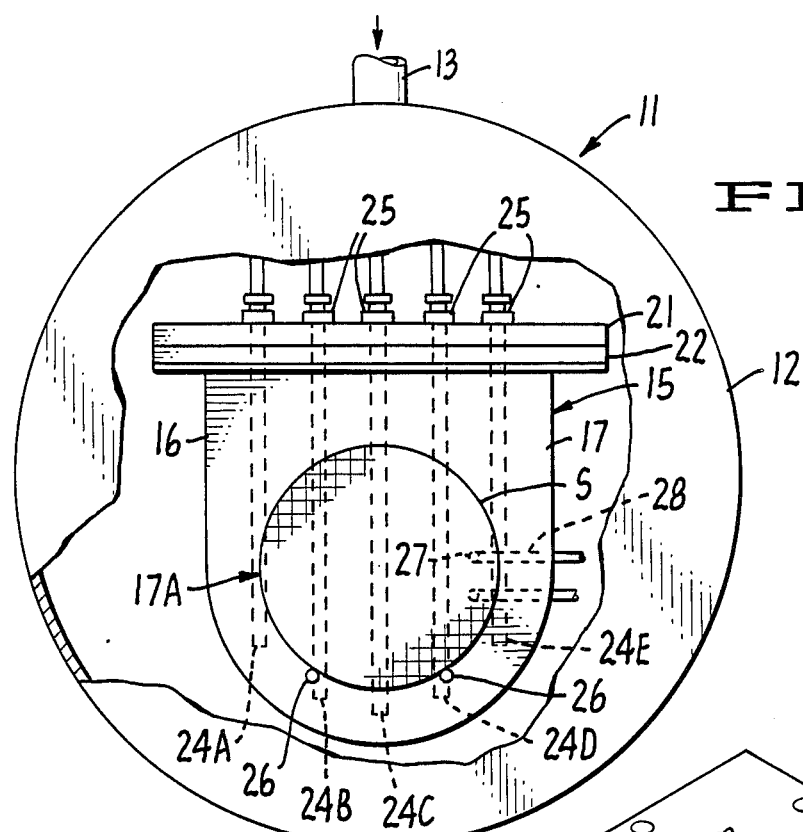
FIG. 1 is an elevational schematic view of the reactor system partially broken away to show a wafer on a heating apparatus of this invention.
Figure 2:
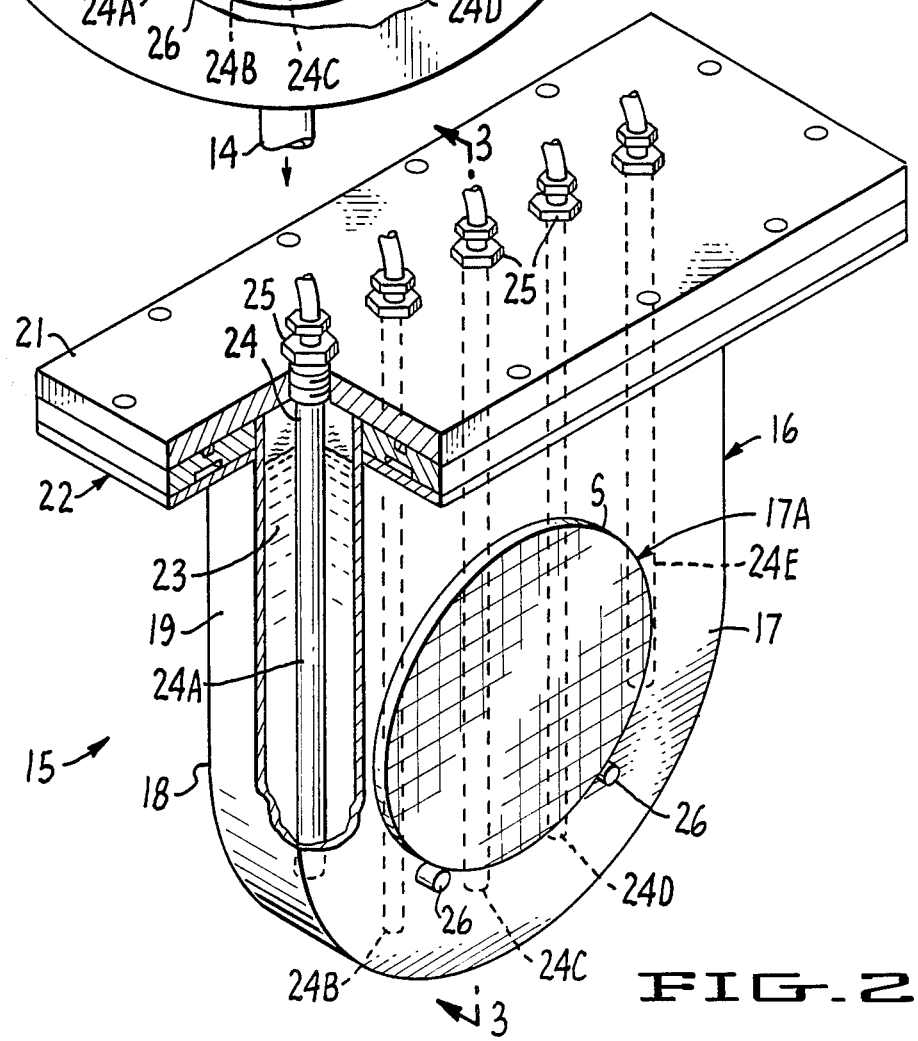
FIG. 2 is a perspective view partially broken away, of the heating apparatus shown in FIG. 1.
Figure 3:
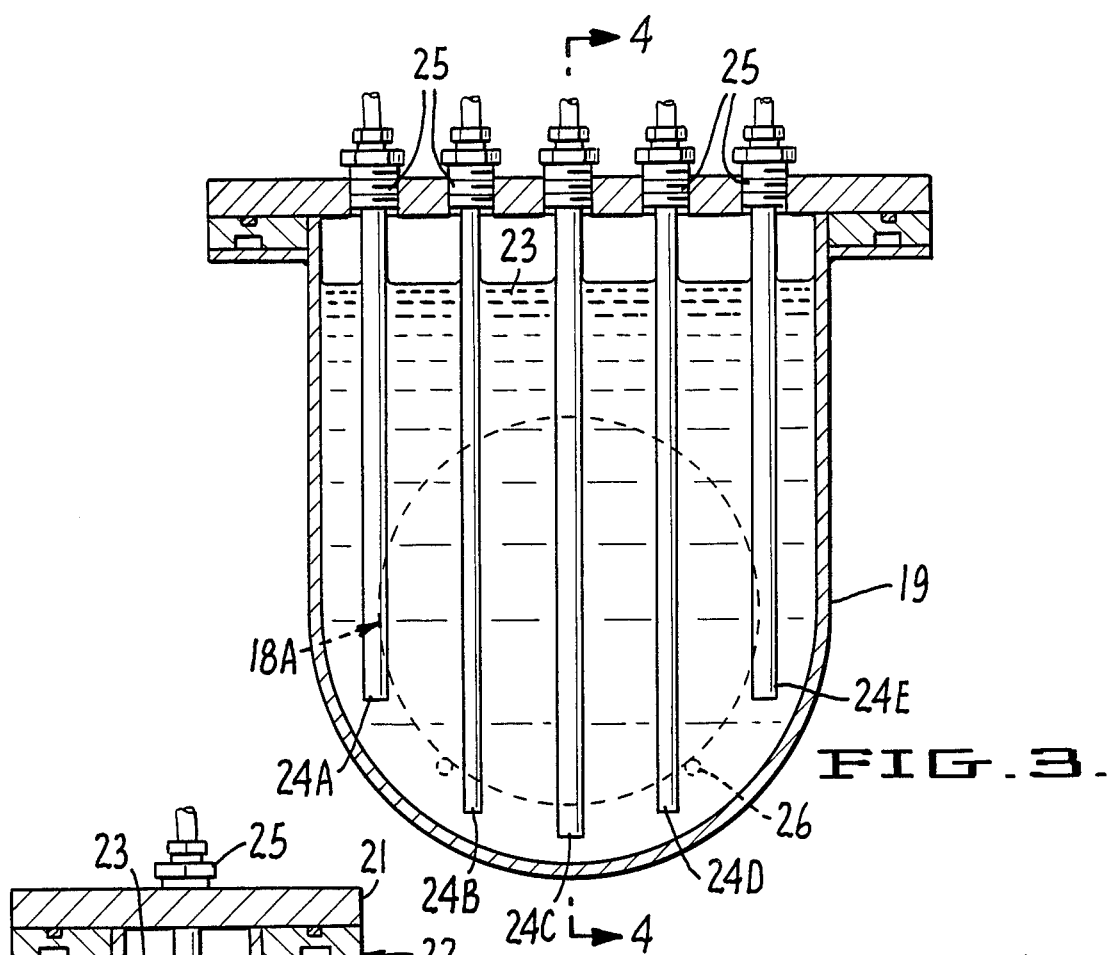
FIG. 3 is an elevational, sectional view of the apparatus shown in FIG. 2.

The preferred embodiment of the improved heating apparatus designed to deliver maximum temperature uniformity and maximum uniformity of thin film deposition processes is described herein. This embodiment is premised on the utilization of a vapor phase chemical reaction chamber in which the heating apparatus, supporting the substrates to be coated, is positioned therein. Functioning together, the reaction chamber and the improved heating apparatus will be hereinafter referred to as the "reaction system."

The chemical epitaxial deposition procedure, which takes place within the reaction system, is generally the same as those previously employed with other known deposition procedures. Since the operational details of epitaxial film growth are well known and understood in the chemical deposition art they will be omitted from the present disclosure.

Referring to the drawing with particular reference to FIGS. 1–4, a reaction system 11 and a heating apparatus 15 therein is shown in generally schematic fashion. The reaction system includes a reaction chamber 12 having a reactant material inlet 13 and outlet 14. The appropriate gas valves, electrical power sources, and other attendant mechanisms are omitted. For purposes of clarity, only those portions of the heating apparatus 15 necessary to illustrate the invention have been included in the drawings. It is to be understood that all portions illustrated are intended to be supported within the reaction chamber in conventional functional fashion.

The heating apparatus 15 comprises a housing or container 16 having spaced apart front and back walls 17 and 18, the lower ends of which are semicircular in shape and the sides and lower ends of which are joined together by a wall 19. A removable top closure 21 sealably secured to a flange 22 surrounding and secured to the upper ends of walls 17, 18 and 19 permit access to the interior of the container 16.

Preferably the Walls of the apparatus are formed from materials with high conductive properties, such as solid silicon carbide. Such conductive surfaces are desired to permit maximum transfer of heat to the external surfaces of the walls 17 and 18 and to a wafer or semiconductor substrate S mounted thereon. The container 16 is substantially filled with a low melting point, high boiling point medium or material 23. For processing semiconductor substrates or wafers, the material 23 has a melting point below 350° C. and a boiling point above 1000° C. The preferred material is essentially indium but bismuth and eutectic mixtures of indium and bismuth and other low melting point, high boiling point materials such as tin are also satisfactory.

At least one insulated resistive heating element 24 is positioned directly in the material 23 in the container 16. The element 24 must be capable of generating high temperatures to melt the medium 23 and heat that medium 23 to a sufficiently high temperature without vaporizing the medium 23 so that a semiconductor wafer or substrate positioned in direct contact with the external surface of container walls 17 and 18 will be heated to the elevated temperature necessary to treat the wafer or substrate.

In the embodiment illustrated in FIGS. 1–4, the heating element comprises a series of equally spaced apart straight rod elements 24A–24E which are mounted in sockets 25 in the top closure 21 so that when the top closure 21 is in place closing the top of the container 16, the elements project down in the container 16 and through the medium 23 to adjacent the bottom of the container. With the lower ends of the front and back walls 17 and 18 semicircular in shape the central rod elements 24B–24D in the series of elements are longer than the elements 24A and 24E. The electrical connections from the power source to said elements are not shown but such connections are conventional. Additionally, thermocouples (not shown) are included for monitoring the temperature of the liquid medium so that the liquid temperature can be controlled to heat the wafers and substrates positioned against the container outside walls to the desired temperature.

In the preferred embodiment of FIGS. 1–4 wherein the lower edges of the front and back container walls 17 and 18 are semicircular, circular wafer or substrate heating locations 17A and 18A, respectively, are provided for positioning wafers or substrates S in direct contact with the exterior wall surfaces of container 16 for uniform conduction heating of the substrates S with heat conducted from the liquid medium 23 through the container walls 17 and 18 to the locations 17A and 18A. The liquid uniformly conducts the heat to the container walls. The use of a series of equally spaced apart heating elements in the medium enhances the uniformity of the temperature across the heating locations 17A and 18A.

Figures 4, 6, 7:
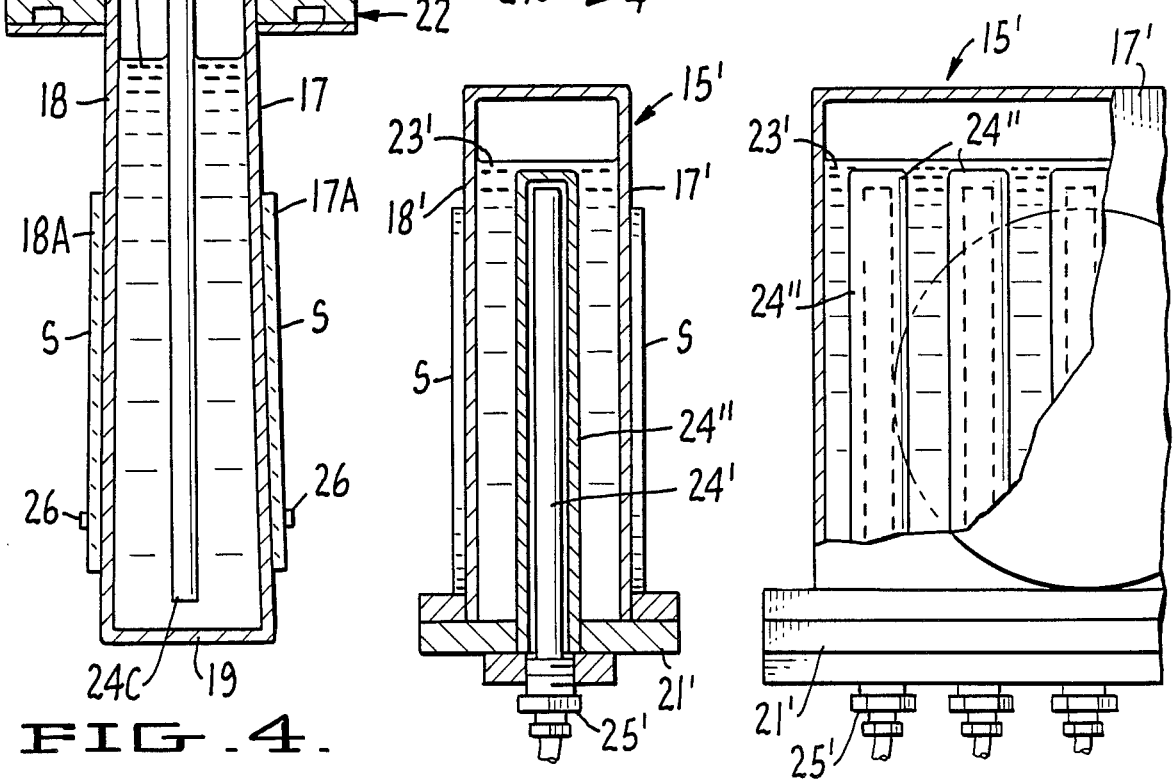
FIG. 4 is a cross-sectional view of the structure shown in FIG. 3 taken along line 3—3 in the direction of the arrows.
FIG. 6 is an end view and FIG. 7 is a front view, partially broken away, showing an alternative embodiment of the present invention.

For aiding in support of the substrates S at the heating locations 17A and 18A, a pair of pegs 26 is provided along the lower semicircular periphery of the heating locations 17A and 18A. The edge of a substrate S will rest on a pair of pegs 26. Additionally, the lower end of container 16 is slightly thicker than the upper end as shown in FIG. 4 so that upwardly the walls 17 and 18 and the substrates S tilt slightly inwardly.

To aid in removing the substrates S from the heating locations 17A and 18A, a port 27 (or ports) exists in the container wall within the heating location and communicates through a wall passageway 28 with a gas source, typically process gas (not shown) which can blow gas out through port 27 to remove the substrate S.

In chemical vapor deposition processing of substrate S in the reactor system 11, a pair of substrates are positioned on the pegs 26 and pulled into place at the heating locations 17 and 18 by drawing gas in through ports 27.

As the heat transfer medium 23 is heated to a temperature short of causing vaporization by the resistance heat elements, heat is uniformly transferred to the internal walls of the container 16 through convection. Then, by the conductive properties of the container walls 17 and 18, heat is uniformly distributed through the walls to the surface of the substrate S. Reation gas is pumped into and out of the reaction chamber 13 via inlet 13 and outlet 14, respectively. In turn, the heated exposed surface of the substrate, which is the surface to be treated, reacts with the gas systematically introduced into the reaction chamber resulting in uniform coating with the desired thin film. The flow of reation gas is stopped, the reaction chamber purged and opened and gas blown out of ports 26 to remove the substrates S.

Because of its inherent properties, pure indium is preferred as the heat transfer medium. Bismuth, or some eutectic mixture of indium and bismuth or indium and tin can also be used. Indium has very low viscosity in the molten state even at temperatures slightly above the melting point, similar to water. Low viscosity is crucial because conductive and convective heat transferring properties are inversely proportional to heat transfer uniformity. Hence, the lower the viscosity of the medium the less resistance to flow of the heat transfer medium and thus the heat, the higher the efficiency in heat transfer.

Moreover, both indium and bismuth possess the requisite temperature range of melting points of less than 350° C. and boiling points greater than 1000° C. which is necessary for the reaction process. The melting point values of indium and bismuth are 156° C. and 271° C., respectively; and the boiling point values of the same are 2087° C. and 1420° C., respectively. The melting point of a 50 weight % indium-bismuth eutectic is approximately 89° C. and the boiling point is over 1500° C. Indium does not exhibit the toxicity of bismuth or many other metals.

Other material properties considered in selecting metals as the heat transferring medium and which are appropriate for insuring maximum system and product efficiencies include: a metal non-reactive to the container materials and the materials used in the reaction, a metal non-toxic and non-hazardous to the personnel handling such materials, a metal non-permeable through the container walls and in which the material of the container walls is not soluble and a thermally conductive metal with a low vapor pressure at temperatures up to and exceeding 1200° C. Furthermore, unless the metal has been contaminated by spilling or the like, indium and bismuth are not easily oxidized and therefore are indefinitely usable.

While the preferred embodiment of the application has been described with respect to a thin film chemical vapor deposition process but is equally applicable to other semiconductor vapor fabrication processes such as physical vapor deposition, plasma enhanced chemical vapor deposition and thermal oxidation.

Figures 5A, 5B:
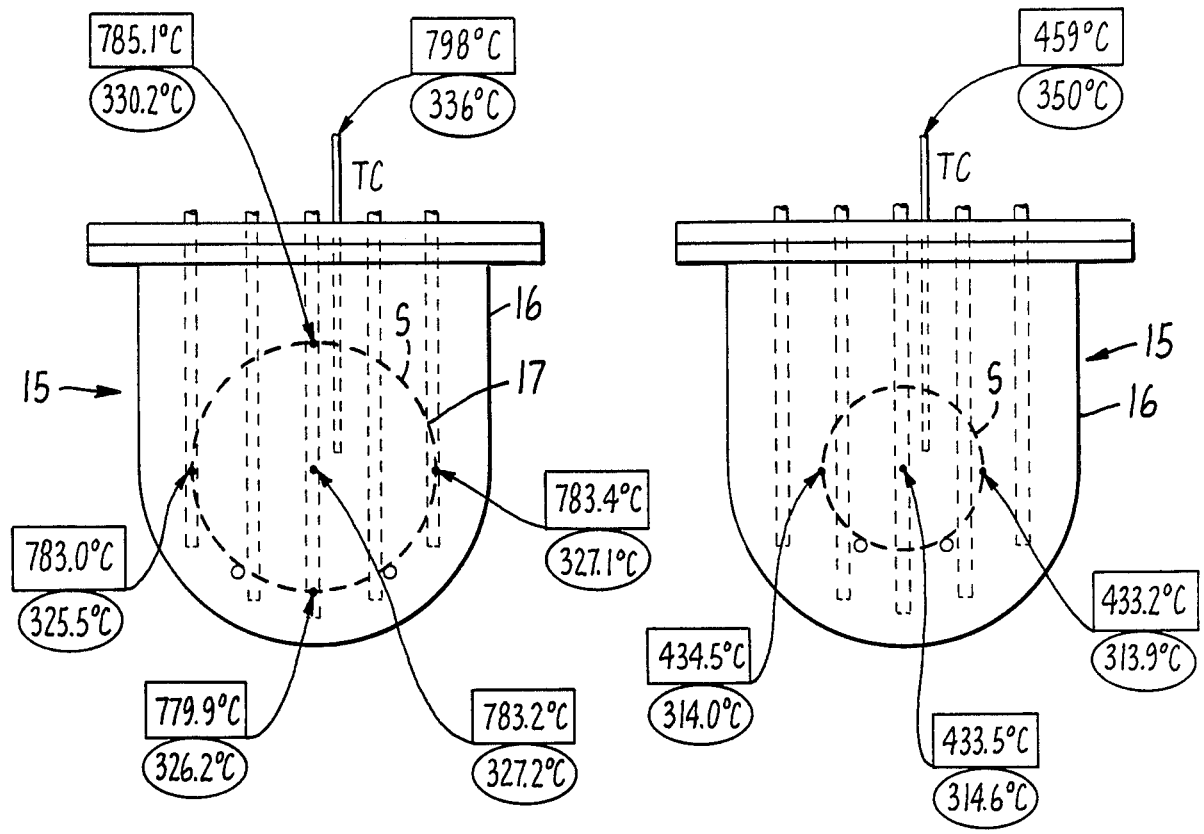
FIGS. 5A and 5B are schematic illustrations showing the temperature uniformity obtained across the wafer heating surface of a heating apparatus as illustrated in FIGS. 1–4.

The present invention produces an unusually uniform temperature across the substrate heating locations and areas. FIG. 5A illustrates different temperatures measured at the designated positions on the surface of the heating apparatus 15. FIG. 5 illustrates different temperatures measured on the exposed face of a four-inch diameter silicon wafer positioned on the heater 16.

In FIG. 5A, the schematic outline of the heating apparatus 15 is shown with the outline of a six-inch wafer also shown on the surface. Tests were made using a container 16, ten inches wide, eleven inches high and 1¾ inch thick, made of 304 stainless steel which had been heat treated after welding and with the wall thickness on one wafer side of the container 16 ¼ inch thick and on the other side ½ inch thick. The container included five ½ inch diameter rods of the general configuration illustrated in FIG. 3, two 8-inch rods, two 10-inch rods and one 12-inch rods, positioned within a heat transfer medium of pure indium that was about nine inches deep in the container 16. The container was positioned inside and spaced from a gold plated stainless steel heat shield. To each of the five rods, 1.5 kilowatts was applied, and in the particular tests, there was less than five kilowatts directed into the heating medium. The rods were high temperature cartridge heaters, models CM ½ inch insulated stainless steel sold by Fast Heat of Elmhurst, Ill.

Two different sets of temperature measurements were taken at each of the five designated positions on the front wall of container 16. The first temperature measurements which are enclosed in rectangles were taken with energy applied to the heater rods and the temperature of the indium inside the container determined by a thermocouple TC to be 798° C. The measurements at this temperature and in the indicated configuration show a variation of no greater than ±0.38% on the wafer heating location of the face of the container 16.

The second set of temperature readings which are shown circled were taken after the power had been turned off to the heaters and the temperature reading of the indium via the thermocouple had fallen to 336° C. and show a temperature variation of no greater than ±0.9%.

FIG. 5B illustrates temperature readings taken using the apparatus described above with reference to FIG. 5A except that the heat shield was not used and a temperature measurements were made directly on the surface of a 4-inch diameter wafer mounted on the front face of the heating apparatus 15. Five cartridge heaters were used in this test all type CIR ⅜-inch diameter heaters made by Chromalox Industrial Heating Products of Pittsburgh, Penna. There were two 8-inch rods type 2080, two 10-inch rods type 2101, and one 12-inch rod type 2121. 0.7 kw was applied to each of the 8-inch rods and 1 kw was applied to each of the other three rods. The readings shown in rectangles were taken with energy applied to the heater rods and with the temperature of the indium stabilized at 459° C. as determined through the thermocouple TC. The temperature variation was no more than ±0.12%. The set of circled readings was taken as the indium was being heated up and was read to be 350° C. The variation in temperature across the wafer was no more than 0.11%.

Obviously, various modifications can be made in the invention as illustrated in the preferred embodiment of FIGS. 1-4. For example, the heating elements 24 could project upwardly into the heat transfer medium 23, and while it is preferred to have the heating elements directly in the heat transfer medium, the elements could be located within a sleeve in the medium. Such a construction is illustrated in FIGS. 6 and 7 wherein the container is positioned upside down relative to the container embodiments FIGS. 1-4 with the container closure 21' position on the bottom of the apparatus. The heating elements 24' project upwardly into hollow cylindrical sleeves 24" which are secured to the closure 21' and project into the heat transfer medium 23'. The heating elements 24' can be in conducting contact with the sleeves 24".

Figures 8A, 8B, 8C:
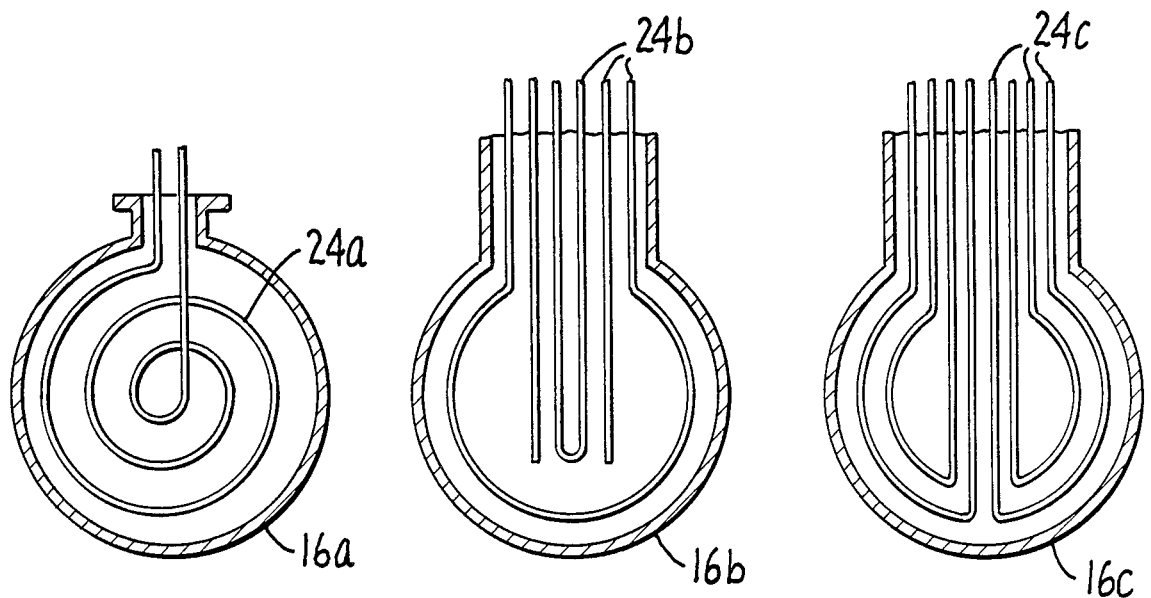
FIGS. 8A, 8B and 8C are schematic elevational views illustrating alternative heater element configurations.

FIGS. 8A, 8B and 8C are schematic elevational views illustrating alternative heater element configurations in place of the straight rod configurations shown for the preferred embodiment of FIGS. 1-4. In FIG. 8A, the chamber 16a is completely circular and the heater element 24a there within is arranged in a spiral configuration.

In FIG. 8B, the chamber 16b is semicircular and contains some straight and some curved heating elements 24b. In the configuration shown in FIG. 8C, the container 16c is again semicircular and the heater rods arranged as loops 24c within the chamber.

Figure 9:
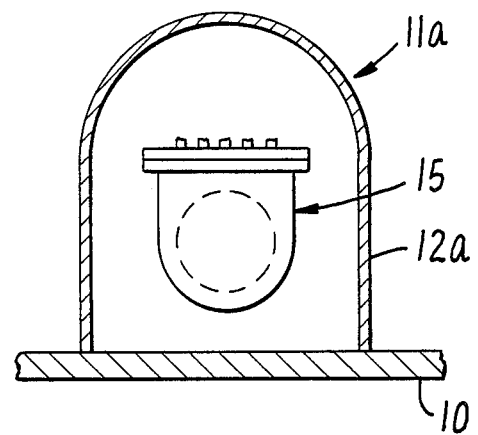
FIG. 9 is a schematic elevational view illustrating an alternative arrangement of the heating apparatus within the reaction chamber.

FIG. 9 illustrates an alternative embodiment wherein the reaction chamber 11a is made up of a belljar 12a positioned on a support platform 10 and with the heater apparatus 15 located with the belljar.

While resistance heating with heating elements actually immersed in the heat transfer medium is the preferred embodiment of the present invention, other techniques of heating the heat transfer medium can be utilized such as radiant energy, RF heating, infrared heating, microwave heating, etc.

Figure 10:
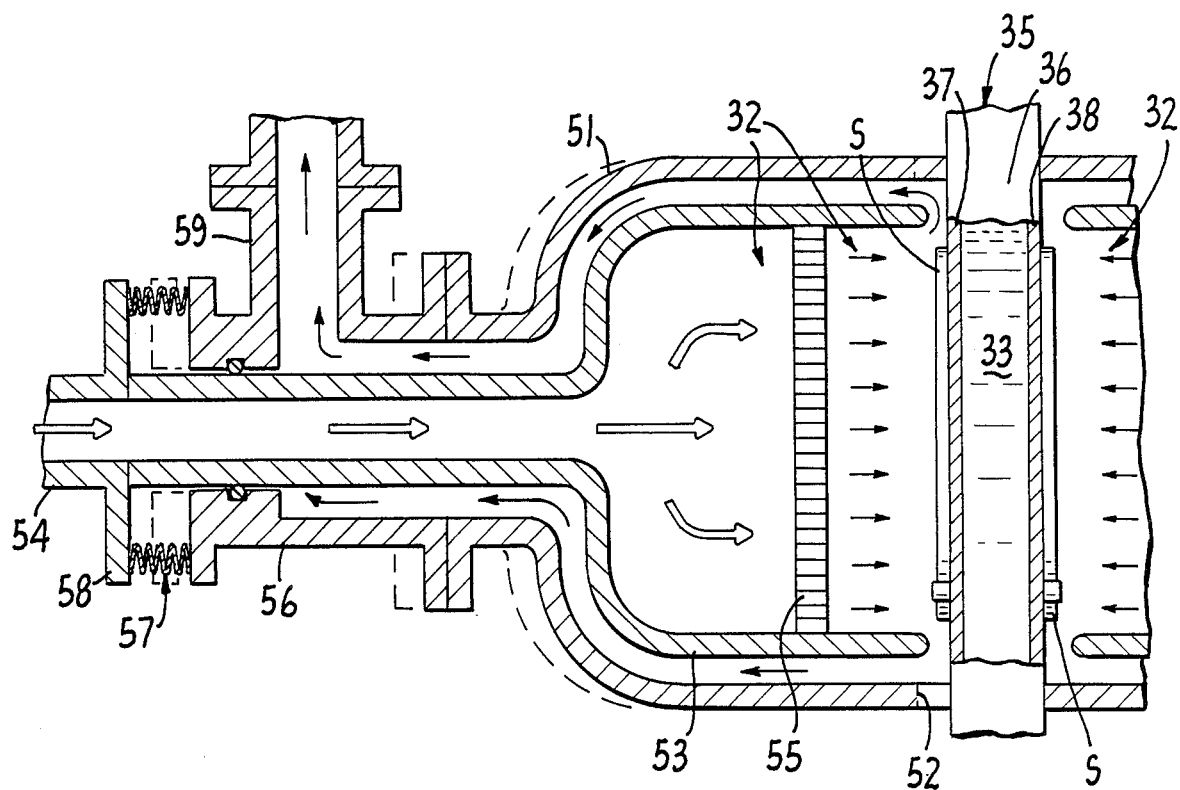
FIG. 10 is an elevational view of still another alternative embodiment of the present invention.

The heating method and apparatus of the present invention is readily amenable to automation of various fabricating steps in the semiconductor substrate or wafer fabrication process. A structure more adapted to automation is illustrated in FIG. 10 which illustrates the heating apparatus 35 comprising the container 36 with front and back walls 37, 38 located between a pair of reaction chambers 32, one of which is only partially shown. The reaction chamber 32 includes an outer wall 51 somewhat in the form of a hollow belljar, the larger open end of which is connected to the heating apparatus 37 around three sides thereof but open on the four side at 52 for movement of the wafer S into the chamber 51 against one of the walls 37 and 38 of the heating apparatus. Inside the chamber member 51 is another chamber member 53 of similar shape, but smaller size providing a space between the members 51 and 53 for exhaust of reactant materials. Member 53 has a hollow cylindrical stem 54 which serves as an inlet for introducing reactant gases into the chamber member 53 in a direction toward the wafer S position at the larger opposite end of the chamber 53. A diffuser plate 55 is shown positioned in the larger portion of the chamber 53 for diffusing and distributing the reactant gases for uniform application to the face of the wafer S. A hollow cylindrical sleeve 56 is sealably connected to the end of chamber 51 remote from the location of the wafer S and is connected by a flexible joint 57 to a flange 58 on the stem 54 of the inner chamber 53. A lateral outlet port 59 extends from the sleeve 56 and provides communication to the annular region between the sleeve 56 and the stem 54 which is in turn in communication with the space between chambers 51 and 53. Processing gases can be introduced through the stem 54 into the interior of chamber 53 through the diffuser 55 for direct application on the face of the wafer S. Gases oan be exhausted from the region adjacent the face of wafer S through the space between chambers 51 and 53 and out the exhaust port 59. The flexible joint 57 allows movement of at least a portion of the outer chamber wall 51 on the port side of the heating apparatus 56 to open and close a region enabling the wafer to be inserted into the reaction chamber nd positioned on the wall of the heater apparatus 35 and then removed from the reaction chamber after the appropriate processing step. The wafers can be transported to and from the reactor system in conventional carriers or cassettes and can actually move through a similarly configured chamber apparatus for cleaning immediately prior to processing in the reaction chamber. The heaters for heating the heat transfer medium 33 are not shown in the schematic illustration of the embodiment in FIG. 10.

The terms and expressions which have been employed here are used as terms of description and not of limitations, and there is no intention, in the use of such terms and expressions, of excluding equivalents of the features shown and described, or portions thereof, it being recognized that various modifications are possible within the scope of the invention claimed.

What is claimed:

1. An apparatus for heating semiconductor substrates, comprising:
    a heating container having a thermally conductive flat wall for heating of semiconductor substrates;
    support means for supporting at least one semiconductor substrate against the external surface of said container wall at a substrate heating location;
    a heat transfer means comprising a low melting point, high boiling point metal contained within said container at least to the level of the top of the substrate heating location and in contact with said wall for uniformly transferring heat to said container and said substrate heating location; and
    heating means for heating said heat transfer means whereby heat is transferred from said heating means through said metal to said container wall to heat said external surface of said container wall to a substantially uniform temperature across said substrate heating location.

2. An apparatus for heating semiconductor substrates, as defined in claim 1, wherein said heat transfer means comprises essentially indium.

3. An apparatus for heating semiconductor substrates, as defined in claim 1, wherein said heat transfer means comprises essentially bismuth.

4. An apparatus for heating semiconductor substrates, as defined in claim 1, wherein said heat transfer means comprises essentially a eutectic of indium and bismuth.

5. An apparatus for heating semiconductor substrates, as defined in claim 1, wherein said heat transfer means has a melting point below 350° C. and a boiling point above 1000° C.

6. An apparatus for heating semiconductor substrates, as defined in claim 1, wherein said container surfaces are solid silicon carbide.

7. An apparatus for heating semiconductor substrates, as defined in claim 1, wherein said heating container flat wall is substantially vertical and said support means is constructed for supporting at least one substrate in a substantially vertical orientation.

8. An apparatus for heating semiconductor substrates, as defined in claim 7, including at least one gas port located on the external surface of said container at said substrate heating location and communicating with a gas source and means for expelling a process gas out of said port for pushing the substrate from said heating location.

9. An apparatus for heating semiconductor substrates, as defined in claim 1, wherein said heating means includes at least one resistance heat element located within and in direct contact with said heat transfer means.

10. An apparatus for heating semiconductor substrates, as defined in claim 1, wherein said heating means includes radiant heating means.

11. An apparatus for heating semiconductor substrates, as defined in claim 9, wherein said element is sheathed in dialectric.

12. A reaction apparatus for conducting treatment of thin film materials onto semiconductor substrates, said apparatus comprising:
a reaction chamber;
a substrate supporting and heating assembly in said chamber comprising:
a heating container composed of thermally conductive material and having a flat wall for heating of semiconductor substrates,
support means for supporting at least one semiconductor substrate against the external surface of said wall at a substrate heating location,
heat transfer means comprising a low melting point, high boiling point metal contained within said container at least to the level of the top of the substrate heating location and in contact with said wall, and
heating means for heating said heat transfer means; and
transport means for transporting reactant materials into and out of said chamber whereby heat is transferred from said heating means through said metal to said container wall to heat said external surfaces of said container wall to a substantially uniform temperature across said substrate heating location for uniformly heating a substrate during reaction with reactant materials.

13. The apparatus of claim 12, wherein said heat transfer means comprises essentially indium.

14. The apparatus of claim 12, wherein said heat transfer means comprises essentially bismuth.

15. The apparatus of claim 12, wherein in said heat transfer means comprises essentially a eutectic of indium and bismuth.

16. The apparatus of claim 12, wherein said heat transfer means has a melting point below 350° C. and a boiling point above 1000° C.

17. Apparatus for heating semiconductor substrates comprising
a heating container having at least one thermally conductive wall member adapted to support and to conduct heat uniformly to a semiconductor substrate at a substrate heating location on the external surface of said wall member;
a low melting point, high boiling point metal in contact with the entire area of the internal wall surface of said wall member corresponding to the normally projected area of said substrate heating location onto said internal surface; and
means for heating said metal whereby heat is transferred from said heating means to said wall member and heats said external surface of said wall member to a substantially uniform temperature across said substrate heating location.

18. The apparatus of claim 17 wherein said metal has a melting point below 350° and a boiling point above 1000° C.

19. The apparatus of claim 17 wherein said metal is essentially indium.

20. The apparatus of claim 17 wherein said metal is essentially bismuth.

21. The apparatus of claim 17 wherein said metal is an eutectic of indium and bismuth.

22. Semiconductor wafer processing apparatus comprising, in combination,
a processing housing have a substantially horizontal axis,
a heat container having at least one thermally conductive wall member adapted to support a semiconductor substrate substantially vertically at a substrate heating position on the external surface of said wall member along said housing horizontal axis,
a low melting point, high boiling point metal in contact with the entire area of the internal wall surface of said wall member corresponding to the normally projected area of said substrate heating locaion onto said internal surface,
means for heating said metal whereby heat is transferred from said heating means to said wall member and heats said external surface of said wall member to substantially uniform temperature across said substrate heating location,
a first housing member centered on said horizontal axis surrounding said substrate heating location,
means for introducing and directing a treatment medium into said first housing member in a direction substantially parallel to said horizontal axis and toward said substrate heating location,
said first housing member comprising a first inner cylindrical wall portion and a second outer cylindrical wall portion,
said wall portions being coaxial and defining an inner cylindrical chamber for directing the treatment medium toward said substrate heating location and an outer annular chamber for directing the treatment medium away from said substrate heating location.

23. The apparatus of claim 22 wherein
said heating container includes a pair of parallel spaced apart wall members for supporting at least a pair of semiconductor substrates at substrate heating locations on the external surfaces with the free faces of the substrates facing in opposite directions along said housing horizontal axis,
a second housing member centered on said horizontal axis on the other side of said heating container from said first housing,
said second housing member comprising a second housing first inner cylindrical wall portion and a second housing second outer cylindrical wall portion, said housing wall portions being coaxial and defining a second housing inner cylindrical chamber for directing the treatment medium toward said second housing substrate heating location and a second housing outer annular chamber for directing the treatment medium away from said second housing substrate heating location and means for introducing and directing a treatment medium into said second housing member in a direction substantially parallel to said horizontal axis and toward said second housing substrate heating location.

24. The apparatus of claim 22 wherein said metal has a melting point below 350° and a boiling point above 1000° C.

25. The apparatus of claim 22 wherein said metal is essentially indium.

26. The apparatus of claim 22 wherein said metal is essentially bismuth.

27. The apparatus of claim 22 wherein said metal is an eutectic of indium and bismuth.

* * * * *